United States Patent
Jeddeloh

(10) Patent No.: US 10,445,025 B2
(45) Date of Patent: Oct. 15, 2019

(54) APPARATUSES AND METHODS HAVING MEMORY TIER STRUCTURE AND RECURSIVELY SEARCHING BETWEEN TIERS FOR ADDRESS IN A TRANSLATION TABLE WHERE INFORMATION IS ONLY DIRECTLY TRANSFERRED BETWEEN CONTROLLERS

(71) Applicant: Micron Technology, Inc., Boise, ID (US)

(72) Inventor: Joe M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/218,666

(22) Filed: Mar. 18, 2014

(65) Prior Publication Data
US 2015/0268875 A1    Sep. 24, 2015

(51) Int. Cl.
   *G06F 3/06*    (2006.01)
   *G11C 7/10*    (2006.01)
   *G11C 5/02*    (2006.01)

(52) U.S. Cl.
   CPC .............. *G06F 3/068* (2013.01); *G06F 3/061* (2013.01); *G06F 3/0604* (2013.01); *G06F 3/0649* (2013.01); *G06F 3/0685* (2013.01); *G11C 5/025* (2013.01); *G11C 7/10* (2013.01)

(58) Field of Classification Search
   CPC combination set(s) only.
   See application file for complete search history.

(56) References Cited

U.S. PATENT DOCUMENTS

| | | | | |
|---|---|---|---|---|
| 5,586,291 A | * | 12/1996 | Lasker | G06F 11/1435 711/113 |
| 5,682,522 A | * | 10/1997 | Huang et al. | 345/542 |
| 6,105,103 A | * | 8/2000 | Courtright, II | G06F 3/0608 707/999.202 |
| 2005/0102444 A1 | * | 5/2005 | Cruz | G06F 13/1605 710/22 |
| 2006/0075193 A1 | * | 4/2006 | Magoshi | 711/122 |
| 2007/0288692 A1 | * | 12/2007 | Bruce et al. | 711/113 |

(Continued)

FOREIGN PATENT DOCUMENTS

WO    WO-2013028849 A1    2/2013

OTHER PUBLICATIONS

Comparison of DDRx and SDRAM. Whitepaper [online]. Freescale Semiconductor, 2008 [retrived on Jul. 29, 2015]. Retrieved from the Internet <http://cache.freescale.com/files/32bit/doc/white_paper/DDRSDRAMWP.pdf>.*

*Primary Examiner* — Rocio Del Mar Perez-Velez
*Assistant Examiner* — Chie Yew
(74) *Attorney, Agent, or Firm* — Schwegman Lundberg & Woessner, P.A.

(57) ABSTRACT

Some embodiments include apparatuses and methods having a memory unit and a controller device. The controller device can be configured to receive a request from a host device and access a data structure in the memory unit to determine whether information associated with the request is in the data structure. The controller device can be configured such that if a fault related to accessing the data structure occurs, the controller device continues searching for the information associated with the request without notifying the host device of the fault.

27 Claims, 5 Drawing Sheets

(56) References Cited

U.S. PATENT DOCUMENTS

| | | | |
|---|---|---|---|
| 2008/0177923 A1* | 7/2008 | Klein | G06F 13/1673 710/306 |
| 2009/0164702 A1 | 6/2009 | Kern | |
| 2009/0235014 A1* | 9/2009 | Yim et al. | 711/103 |
| 2010/0121994 A1* | 5/2010 | Kim | G06F 13/1684 710/51 |
| 2010/0293420 A1* | 11/2010 | Kapil et al. | 714/710 |
| 2011/0276757 A1 | 11/2011 | Jindo | |
| 2011/0296077 A1* | 12/2011 | Jobs | G06F 13/1678 711/1 |
| 2012/0023300 A1 | 1/2012 | Tremaine et al. | |
| 2012/0124251 A1 | 5/2012 | Hnatko et al. | |
| 2012/0280378 A1* | 11/2012 | Upadhyayula et al. | 257/676 |
| 2012/0317366 A1 | 12/2012 | Sato et al. | |
| 2013/0036314 A1 | 2/2013 | Glew et al. | |
| 2013/0097680 A1 | 4/2013 | Bendapudi et al. | |
| 2013/0132690 A1 | 5/2013 | Epstein | |
| 2013/0148401 A1* | 6/2013 | Fai et al. | 365/63 |
| 2013/0159664 A1 | 6/2013 | Blinzer et al. | |
| 2014/0019688 A1* | 1/2014 | Ghodsnia | G06F 12/0866 711/135 |
| 2014/0176187 A1* | 6/2014 | Jayasena et al. | 326/39 |

* cited by examiner

APPARATUSES AND METHODS HAVING MEMORY TIER STRUCTURE AND RECURSIVELY SEARCHING BETWEEN TIERS FOR ADDRESS IN A TRANSLATION TABLE WHERE INFORMATION IS ONLY DIRECTLY TRANSFERRED BETWEEN CONTROLLERS

BACKGROUND

Many electronic systems, such as computers, usually have a host device to process information in the system. The system often includes a memory device to store information. During an operation, such a read operation, the host device may request information from a specific location in the memory device. In some situations, the requested information may have been moved to another memory device (e.g., to a hard disk) to make room for new information in the memory device. In these situations, the host device, the operating system, or both may perform an additional operation to search for the requested information. In some conventional systems, such an additional operation may be inefficient and may cause operational delay for the host device.

DETAILED DESCRIPTION

Figure 1:
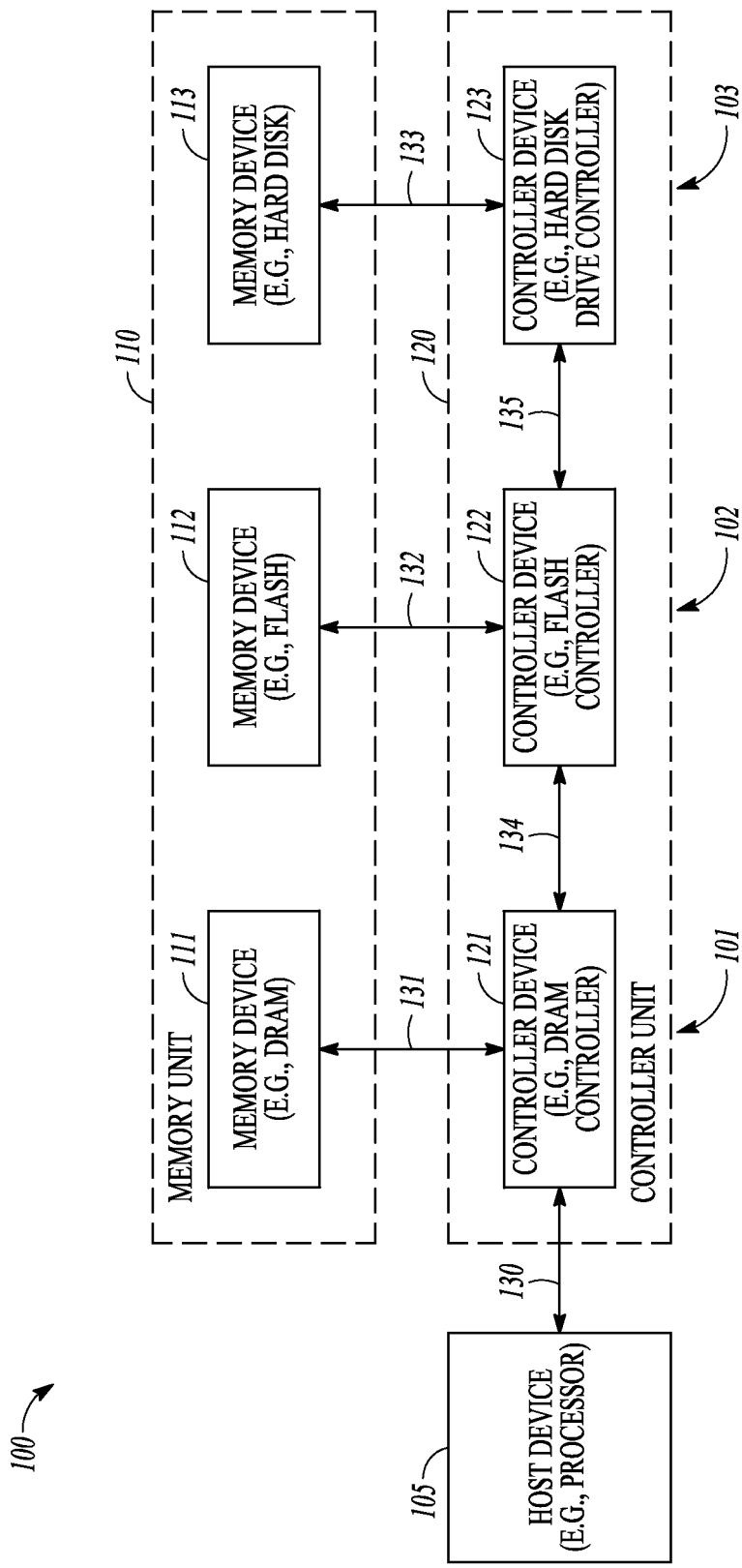
FIG. 1 shows a block diagram of an apparatus including a host device, a memory unit, and a controller unit, according to an embodiment of the invention.

FIG. 1 shows a block diagram of an apparatus 100 including a host device 105, memory unit 110, and a controller unit 120, according to an embodiment of the invention. Apparatus 100 can include or be included in electronic items (e.g., electronic systems) such as computers, digital televisions, digital cameras, cellular phones, and other electronic items. As shown in FIG. 1, apparatus 100 can also include connections 130, 131, 132, 133, 134, and 135 to allow communication among host device 105, memory unit 110, and controller unit 120.

Host device 105 can include a processor (e.g., a general purpose processor), an application-specific processor (e.g., application-specific integrated circuit (ASIC)), or other types of processors. Host device 105 can include a processing unit (e.g., a central processing unit (CPU)) that can include circuitry to perform operations based on software instructions. The operations can include arithmetic and logical operations.

Memory unit 110 can be configured to store information, which can include data (e.g., user data), application software, an operating system (OS) associated with apparatus 100, and other information. Memory unit 110 can include memory devices 111, 112, and 113 that can include memory of different types (e.g., volatile and nonvolatile memory). For example, memory device 111 can include a volatile memory (e.g., a dynamic random access memory (DRAM)) having volatile memory cells (e.g., DRAM cells). Memory device 112 can include a nonvolatile memory device (e.g., a flash memory device) having nonvolatile memory cells (flash memory cells). The flash memory device can include a NAND flash memory device or other kinds of flash memory. Memory device 113 can include a nonvolatile memory device, which can include a disk (e.g., memory storage disk) included in a disk drive (e.g., a hard disk drive (HDD)). In an alternative arrangement, all of memory devices 111, 112, and 113 can include memory of the same type (e.g., volatile memory such as DRAM, nonvolatile memory such as flash memory, or other volatile or nonvolatile memory).

Controller unit 120 can be configured to control a flow of information between memory unit 110 and host device 105 during an operation such as a read or write operation in apparatus 100. For example, in a write operation, controller unit 120 can receive a request (e.g., write request) from host device 105 to store information in memory locations (e.g., memory cells) in memory unit 110. In a write operation, controller unit 120 can cause memory unit 110 to perform a write operation to store the information in one or more of memory devices 111, 112, and 113. In a read operation, controller unit 120 can receive a request (e.g., memory read request) from host device 105 requesting controller unit 120 to provide information (e.g., information previously stored in memory unit 110 in a write operation) from memory unit 110 to host device 105. In a read operation, controller unit 120 can cause memory unit 110 to perform a read operation to obtain information from at least one of memory devices 111, 112, and 113 and provide the obtained information to host device 105.

Controller unit 120 can include controller (e.g., memory controller) devices 121, 122, and 123. Each of controller devices 121, 122, and 123 can be configured to control operations associated with a corresponding memory device. For example, controller device 121 (e.g., DRAM controller) can control a flow of information provided to or obtained from memory device 111. Controller device 122 (e.g., NAND flash controller) can control a flow of information provided to or obtained from memory device 112. Controller device 123 (e.g., hard disk drive controller) can control a flow of information provided to or obtained from memory device 113.

Controller device 121 can be configured to operate as main controller in controller unit 120 to communicate directly with host device 105 to control the flow of information between host device 105 and one or more of memory devices 111, 112, and 113. Controller device 122 can be configured to communicate (e.g., indirectly) with host device 105 through controller device 121. Controller device 123 can be configured to communicate (e.g., indirectly) with host device 105 through controller device 121 or both controller devices 121 and 122.

Different parts of memory unit 110 and different parts of controller unit 120 can be organized into different memory tiers 101, 102, and 103 in apparatus 100. For example, memory device 111 and controller device 121 can be organized into memory tier 101. Memory device 112 and controller device 122 can be organized into memory tier 102. Memory device 113 and controller device 123 can be organized into memory tier 103. A controller device in a memory tier can control operations (e.g., read and write operations) in that memory tier. For example, controller device 121 can control operations in memory tier 101. Controller device 122 can control operations in memory tier 102. Controller device 123 can control operations in memory tier 103.

Memory tiers 101, 102, and 103 can be configured such that information (e.g., pages) frequently used by host device 105 can be stored in one of memory tiers 101, 102, and 103 (e.g., memory tier 101) that is "near" host device 105 and information that is infrequently used by host device 105 can be stored in a "far" memory tier (e.g., memory tier 103). A "near" memory tier (e.g., a higher memory tier) can access information requested by host device 105 in a relatively shorter time than that of a "far" memory tier (e.g., lower memory tier).

Controller unit 120 can provide information (obtained from memory unit 110) to host device 105 with variable latency (e.g., variable read delay) depending on where (e.g., which memory tier) the information is stored. Control timing (e.g., RAS/CAS signals) of conventional DRAM may be removed from communication between host device 105 and the memory structure formed by memory tiers 101, 102, and 103. In an apparatus, controller unit 120 can determine when information (e.g., data) requested by host device 105 is available and inform host device 105 of the availability of the information.

Although apparatus 100 includes different memory tiers 101, 102, and 103 having different types of memory, host device 105 may be unaware of the memory structure formed by memory tiers 101, 102, and 103. Thus, memory tiers 101, 102, and 103 may operate as a large single entity memory system (e.g., a large DRAM) that may replace a conventional combination of DRAM and disk system.

One skilled in the art may readily recognize that apparatus 100 can include additional components, such as components of a system (e.g., a computer), components of a module (e.g., a memory module or a memory controller module), and so forth. Such additional components are omitted from FIG. 1 to help focus on the embodiments described herein.

Figure 2:
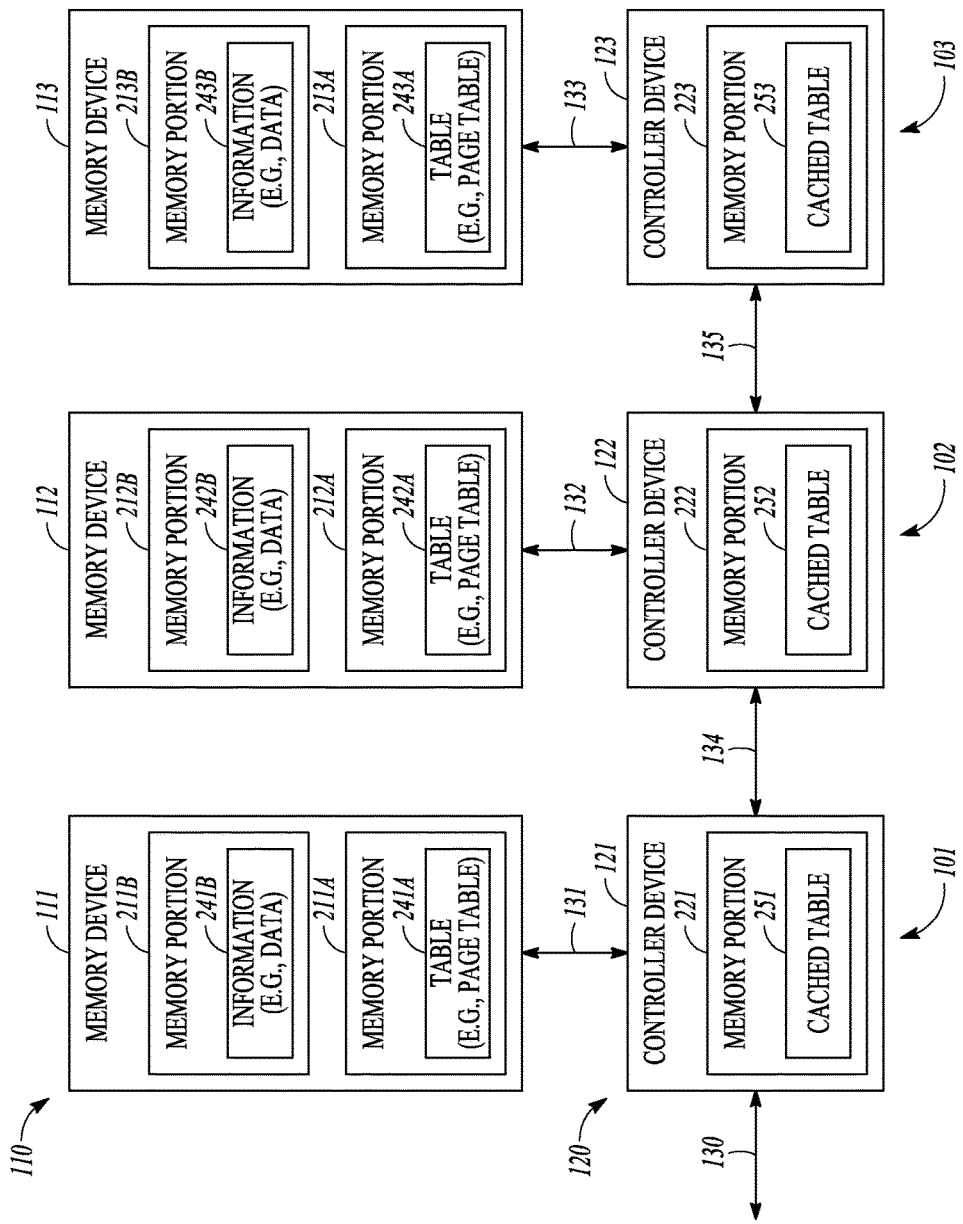
FIG. 2 shows a block diagram of memory tiers of FIG. 1 including memory devices and controller devices, according to an embodiment of the invention.

FIG. 2 shows a block diagram of memory tiers 101, 102, and 103 of FIG. 1 including memory devices 111, 112, 113 and controller devices 121, 122, and 123, according to an embodiment of the invention. As shown in FIG. 2, the memory devices and the controller devices in each of memory tiers 101, 102, and 103 can include different memory portions, which can be configured to store different information, such as user data, page tables, and caches of the page tables.

For example, in memory tier 101, memory device 111 can include memory portions 211A and 211B. Memory portions 211A and 211B can include memory cells of the same type. Alternatively, memory portions 211A and 211B can include memory cells of different types. Memory portion 211B can include memory cells configured to store information 241B that can include user data, software, and/or other information. Memory portion 211A can be configured to store a data structure, such as a table (e.g., page table) 241A, for information stored in (e.g., resident in) memory portion 211B. Table 241A can include physical addresses associated with physical memory locations (e.g., memory cells) in memory portion 211B where information 241B is stored.

Table 241A can also include mappings between logical addresses (e.g., virtual addresses) and physical addresses. Table 241A can include a page table or a portion of the page table used by an operation system associated with apparatus 100, host device 105, or both. The mappings in table 241A can include entries (e.g., page table entries). Each of the entries can include a mapping between a logical address and a physical address. The logical address in the mapping can be included in a memory address space used by the operating system, host device 105, or both. The physical address in the mapping can include an address of a physical memory location in memory portion 211B. Memory device 111 and controller device 121 can access a physical memory location based on the physical address.

Memory space for table 241A can be varied and can be based on memory tier size and page size. For example, table 241A can be configured to store from 4K to 1M pages (or larger) of a page table. Larger pages may provide an efficient access to a memory device (e.g., a flash memory) in a memory tier (e.g., memory device 112 in memory tier 102) among memory tiers 101, 102, and 103.

Controller device 121 can include a memory portion 221. Memory portion 221 and memory portion 211A can include different types of memory cells. For example, memory portion 221 can include static random access memory (SRAM) cells and memory portion 211B can include DRAM cells. Memory portion 221 can be configured to store a data structure, which can include a cached table (e.g., cached page table) 251, such as a cache of information in table 241A (e.g., a portion of the information in table 241A). For example, the information in cached table 251 can include frequently used entries (e.g., active entries) among the entries in table 241A. Based on the information in cached table 251 and table 241A, controller device 121 can determine whether information (e.g., data) associated with a request (e.g., a memory read request) from host device 105 is stored in memory tier 101.

Each of memory tiers 102 and 103 can include a structure similar to that of memory tier 101. For example, in memory tier 102, memory device 112 can include memory portions 212A and 212B. Memory portions 212A and 212B can include memory cells (e.g., flash memory cells) of the same type. Alternatively, memory portions 212A and 212B can include memory cells of different types. Memory portion 212B can include memory cells configured to store information 242B that can include user data, software, and/or other information. Memory portion 212A can be configured to store a data structure, such as a table (e.g., page table) 242A for information stored in (e.g., resident in) memory portion 212B. Table 242A can include physical addresses associated with physical memory locations (e.g., memory cells) in memory portion 212B where information 242B can be stored.

Table 242A can also include mappings between logical addresses and physical addresses. Table 242A can include a page table or a portion of the page table used by an operating system associated with apparatus 100, host device 105, or both. The mappings in table 242A can include entries (e.g., page table entries). Each of the entries can include a mapping between a logical address and a physical address. The logical address in the mapping can be included in a memory address space used by the operating system, host device 105, or both. The physical address in the mapping can include an address of a physical memory location in memory portion 212B. Memory device 112 and controller device 122 can access a physical memory location based on the physical address.

Controller device 122 can include a memory portion 222. Memory portion 222 and memory portion 212A can include different types of memory cells. For example, memory portion 222 can include SRAM cells and memory portion 212B can include flash memory cells. Memory portion 222 can be configured to store a data structure, which can include a cached table (e.g., cached page table) 252, such as a cache of information in table 242A (e.g., a portion of the information in table 242A). For example, the information in cached table 252 can include frequently used entries (e.g., active entries) among the entries in table 242A. Based on the information in tables 252 and 242A, controller device 122 can determine whether information (e.g., data) associated with a request (e.g., a memory read request) from host device 105 is stored in memory tier 102.

In memory tier 103, memory device 113 and memory controller device 123 can include structure similar to that of memory device 111 and memory controller device 121 or memory device 112 and memory controller device 122. For example, memory device 113 can include memory portions 213A and 213B. Memory portion 213B can be configured to store information 243B. Memory portion 213A can be configured to store a data structure, such as a table (e.g., page table) 243A for information resident in memory portion 213B. Table 243A can include physical addresses associated with a physical memory location (e.g., location on a disk) in memory portion 213B where information 243B can be stored. Table 243A can include a page table or a portion of the page table used by an operation system associated with apparatus 100, host device 105, or both. Controller device 123 can include a memory portion 223, which can be configured to store a data structure. The data structure can include a cached table (e.g., cached page table) 253, such as a cache of information in table 243A. Based on the information in tables 253 and 243A, controller device 123 can determine whether information (e.g., data) associated with a request (e.g., a memory read request) from host device 105 is stored in memory tier 103.

The description with reference to FIG. 2 describes a data structure that includes a table (e.g., a page table) as an example. Other types of data structures can be used.

The following description describes an example read operation in memory tiers 101, 102, and 103. In a read operation, host device 105 may send a request (e.g., a memory read request) to controller unit 120 to request information (e.g., user data) that is stored in memory unit 110. The request sent by host device 105 can include a physical address of a physical memory location in memory unit 110 where the requested information may be stored. In a read operation, in response to the request from host device 105, controller unit 120 can access one memory tier after another (e.g., in a sequential order) to obtain information associated with the request. For example, controller unit 120 can initially access memory tier 101 in response to the request from host device 105 to determine whether the requested information is stored in memory tier 101. If the requested information is found in memory tier 101, controller unit 120 can obtain the requested information and provide it to host device 105. If controller unit 120 determines that the requested information is not stored in memory tier 101, controller unit 120 can access one or more of the other memory tiers (e.g., memory tiers 102 and 103) and continue to search for the requested information. In some situations, if controller unit 120 is unable to find the requested information in memory tiers 101, 102, and 103, it may send host device 105 a message (e.g., an error message) indicating that the requested information is not found. Host device 105 and/or the operating system may perform further operations to resolve such situations.

In a read operation, each of controller devices 121, 122, and 123 of controller unit 120 can perform similar operations in a corresponding memory tier that is being accessed in order to determine whether the requested information is stored in that memory tier. For example, after receiving the request from host device 105, controller device 121 can access memory portion 221 to determine whether the requested information is stored in memory tier 101. Controller device 121 can perform a comparison operation to compare an address associated with the request from host device 105 with the addresses in cached table 251. The comparison operation may generate a match indication or a mismatch indication. A match indication is generated if the address associated with the request from host device 105 matches one of the addresses in cached table 251. A mismatch indication is generated if no address among the addresses in cached table 251 matches the address associated with the request from host device 105.

A match indication associated with accessing cached table 251 can indicate that the requested information is stored in memory tier 101. In this case, controller device 121 can cause memory device 111 to perform a read operation to access memory portion 211B. Memory device 111 obtains the requested information from a memory location in memory portion 211B (at the address associated with the request from host device 105). The requested information can be included in (e.g., part of) information 241B. Memory device 111 provides the requested information to controller device 121, which provides the requested information to host device 105.

A mismatch indication associated with accessing cached table 251 can indicate that the requested information may or may not be stored in memory tier 101. Thus, controller device 121 may be unable to determine whether the requested information is stored in memory tier 101 if a mismatch indication associated with accessing cached table 251 is generated. In this case, controller device 121 can access table 241A in memory device 111 to determine whether the requested information is stored in memory tier 101. For example, controller device 121 can perform an additional comparison operation to compare the address associated with the request from host device 105 with the addresses in table 241A. The additional comparison associated with accessing table 241A may generate a match indication if the address associated with the request from host device 105 matches one of the addresses in table 241A. The additional comparison associated with accessing table 241A may generate a mismatch indication if no address among the addresses in table 241A matches the address associated with the request from host device 105. Controller device 121 can be configured such that it may refrain from notifying host device 105 (e.g., may not notify host device 105) whether the address associated with the request from host device 105 matches an address among the addresses in table 241A.

A match indication associated with accessing table 241A can indicate that the requested information is stored in memory tier 101. In this case, controller device 121 can cause memory device 111 to perform a read operation to access memory portion 211B. Memory device 111 obtains the requested information from a memory location in memory portion 211B (at the address associated with the request from host device 105). Memory device 111 provides the requested information to controller device 121, which provides the requested information to host device 105.

A mismatch indication associated with accessing table 241A can indicate that the requested information is not stored in memory tier 101. In this case, controller device 121 can inform controller device 122 to determine whether the requested information is stored in memory tier 102. As described above, table 241A can include a page table used by host device 105. A mismatch indication associated with accessing table 241A can also mean that a fault (e.g., a page fault) related to accessing table 241A has occurred. Controller device 121 can be configured such that, if such a fault occurs, controller device 121 can continue searching for the requested information (e.g., search in memory tier 102) without notifying host device 105 of the fault. Alternatively or additionally, controller device 121 can be configured such that, if such a fault (e.g., page fault) occurs, controller device 121 can notify host device 105 of the fault.

Thus, as described above, controller device 121 can access memory device 111 of memory unit 110 including accessing table 241A to determine whether requested information is stored in memory portion 211B based on whether the address associated with the request from host device 105 is in table 241A. Controller device 121 can be configured such that it can continue to access the memory unit 110 (e.g., access memory tier 102), even if the address associated with the request from host device 105 is not in table 241A, to determine whether the requested information is stored memory tier 102 (e.g., stored in a memory portion 212B) without notifying the host device that the address associated with the request is not in the table 241A.

Controller device 122 can perform operations in memory tier 102 in a fashion similar to that of controller device 121. For example, after controller device 122 is informed by controller device 121 to search for the requested information, controller device 122 can access memory portion 222 to determine whether the requested information is stored in memory tier 102. Controller device 122 can perform a comparison operation to compare the address associated with the request from host device 105 with the addresses in cached table 252. The comparison operation may generate a match indication or a mismatch indication. A match indication is generated if the address associated with the request from host device 105 matches one of the addresses in cached table 252. A mismatch indication is generated if no address among the addresses in cached table 252 matches the address associated with the request from host device 105.

A match indication associated with accessing cached table 252 can indicate that the requested information is stored in memory tier 102. In this case, controller device 122 can cause memory device 112 to perform a read operation to access memory portion 212B. Memory device 112 obtains the requested information from a memory location in memory portion 212B (at the address associated with the request from host device 105). The requested information can be included in (e.g., part of) information 242B. Memory device 112 provides the requested information to controller device 122, which provides the requested information to host device 105 through controller device 121.

A mismatch indication associated with accessing cached table 252 can indicate that the requested information may or may not be stored in memory tier 102. Thus, controller device 122 may be unable to determine whether the requested information is stored in memory tier 102 if a mismatch indication associated with accessing cached table 252 is generated. In this case, controller device 122 can access table 242A in memory device 112 to determine whether the requested information is stored in memory tier 102. For example, controller device 122 can perform an additional comparison operation to compare the address associated with the request from host device 105 with the addresses in table 242A. The additional comparison associated with accessing table 242A may generate a match indication if the address associated with the request from host device 105 matches one of the addresses in table 242A. The additional comparison associated with accessing table 242A may generate a mismatch indication if no address among the addresses in table 242A matches the address associated with the request from host device 105. Controller device 122 can be configured such that it may refrain from notifying host device 105 (e.g., may not notify host device 105) whether the address from host device 105 matches an address among the addresses in table 242A.

A match indication associated with accessing table 242A can indicate that the requested information is stored in memory tier 102. In this case, controller device 122 can cause memory device 112 to perform a read operation to access memory portion 212B. Memory device 112 obtains the requested information from a memory location in memory portion 212B (at the address associated with the request from host device 105). Memory device 112 provides the requested information to controller device 122, which provides the requested information to host device 105.

A mismatch indication associated with accessing table 242A can indicate that the requested information is not stored in memory tier 102. In this case, controller device 122 can inform controller device 123 to determine whether the requested information is stored in memory tier 103. As described above, table 242A can include a page table used by host device 105. A mismatch indication associated with accessing table 242A can also mean that a fault (e.g., a page fault) related to accessing table 242A has occurred. Controller device 122 can be configured such that if such a fault occurs, controller device 122 can continue searching for the requested information (e.g., search in memory tier 103) without notifying host device 105 of the fault. Alternatively or additionally, controller device 122 can be configured such that, if such a fault (e.g., a page fault) occurs, controller device 121 can notify host device 105 of the fault.

Thus, as described above controller device 122 can access memory device 112 of memory unit 110 including accessing table 242A to determine whether requested information is stored in memory portion 212B based on whether the address associated with the request from host device 105 is in table 242A. Controller device 212 can be configured such that it can continue to access the memory unit 110 (e.g., access memory tier 103), even if the address associated with the request from host device 105 is not in table 242A, to determine whether the requested information is stored memory tier 103 (e.g., stored in a memory portion 213B) without notifying the host device that the address is not in the table 242A.

Controller device 123 can perform operations in memory tier 103 in a fashion similar to that of controller device 121 or 122 to obtain the requested information. For example, after controller device 123 is informed by controller device 122 to search for the requested information, controller device 123 can access at least one of cached table 253 and table 243A to determine whether the requested information is stored in memory tier 103. Controller device 122 can perform one or more address comparison operations to compare the address associated with the request from host device 105 with the addresses in cached table 252 and table 243A. Based on the results (e.g., match or mismatch indication) from the comparison operations, controller device 123 can determine whether the requested information is stored in memory tier 103.

In comparison with some conventional arrangements and operations, the arrangement and operations of memory unit 110 and controller unit 120 may be more efficient. For example, a host device in some conventional systems (e.g., systems that use virtual memory) may be notified of a fault (e.g., page fault). In response, the host device may stop a process and then resume that process only after the fault is resolved (e.g., resolved by an operating system). Further, information in some components in the host device (e.g., information in a translation lookaside buffer (TLB)) may also be updated after a fault is resolved. These techniques involving a fault (e.g., page fault) as employed in some conventional systems may be inefficient.

In apparatus 100, however, controller unit 120 may not notify device 105 of a fault (e.g., page fault) and continue to search for information requested by host device 105. Thus, a fault may be hidden from host device 105. This may be more efficient than techniques employed in some convention systems. Alternatively or additionally, controller unit 120 may notify host device 105 of a fault (e.g., page fault).

Controller unit 120 can be configured to manage data movement and page table management (e.g., moving data and/or page tables in and out of memory tiers 101, 102, and 103) without intervention from host device 105 and/or an operating system associated with the apparatus 100. For example, controller unit 120 can be configured to move information in and out of table 241A, 242A, and/or 243A without an intervention from the host device 105 and/or the operating system. In an alternative arrangement, host device 105 and/or an OS can directly manage data movement and page table management. For example, host device 105 can send a command and control information (e.g., data size and address of memory location) to controller unit 120 and direct controller unit 120 to move information in and out of table 241A, 242A, and/or 243A based on the control information. In another alternative arrangement, controller unit 120 and host device 105 can cooperatively share control of the data movement and page table management.

Controller unit 120 and memory unit 110 can be configured such that they can have the ability to move new data (e.g., a new page or new pages) into a higher memory tier (e.g., memory tier 101) and move old data (e.g., a "dirty" page or "dirty" pages) from the higher memory tier to a lower memory tier (memory tier 102 or 103) to make room in the higher memory tier. For example, controller unit 120 and memory unit 110 can move a new page into memory tier 101 and move a "dirty" page from memory tier 101 to memory tier 102 or memory tier 103. In another example, controller unit 120 and memory unit 110 can move a new page into memory tier 102 and move a "dirty" page from memory tier 102 to memory tier 103. The data movement between higher and lower memory tiers may improve performance (e.g., reduce the time for accessing (e.g., searching) information requested by host device 105). The data movement between higher and lower memory tiers can be performed with or without an intervention from host device 105 and/or the operating system.

In the above description with reference to FIG. 2, each of tables 241A, 242A, or 243A in memory unit 110 can be configured such that requested information can be obtained from another memory portion (e.g., 211B, 212B, or 213B) when a match indication is generated (e.g., a match between the address from host device 105 an address in the 241A, 242A, or 243A). In an alternative implementation, each of the tables in memory unit 110 (e.g., table 241A, 242A, or 243A) can be configured to include information such as a table tag, data (e.g., user data) associated with the table tag, and other information. For example, memory portion 211A can be configured such that each of the entries in table 241A can be configured to store a copy of information (e.g., data stored in memory portion 211B) associated with a physical address or a portion (e.g., a tag) of that physical address. Each of the entries in table 241A can also be configured to include error correction code (ECC) information. In an alternative implementation, if a match indication associated with accessing table 241A is generated (e.g., the address from host device 105 is in table 241A), controller device 121 can obtain the data from table 241A and provide the data as the requested information to host device 105. Thus, memory portion 211A in an alternative implementation can be configured as a cache to store information (e.g., data) that may be frequently used by host device 105.

Similarly, each of tables 242A (in memory device 112) and 243A (in memory device 113) in memory unit 110 can alternatively be configured to include information (e.g., a table tag, data associated with the table tag, and other information) similar to that included in table 241A in the above described alternative implementation.

Figure 3B:
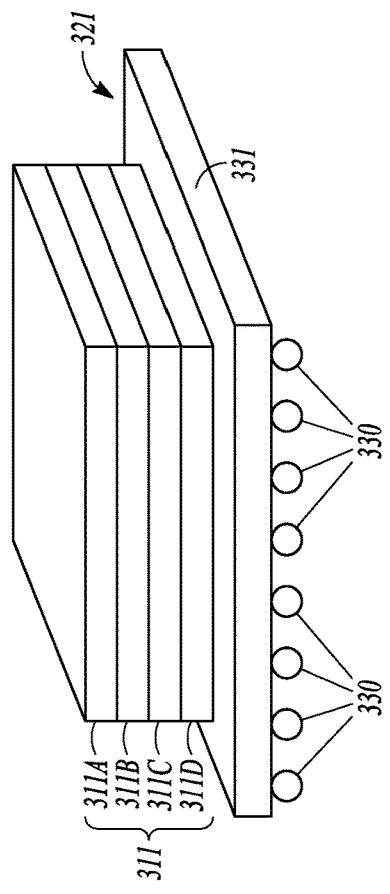
FIG. 3B shows a perspective view of the memory device and the controller device of FIG. 3A arranged in a stack, according to an embodiment of the invention.
Figure 3A:
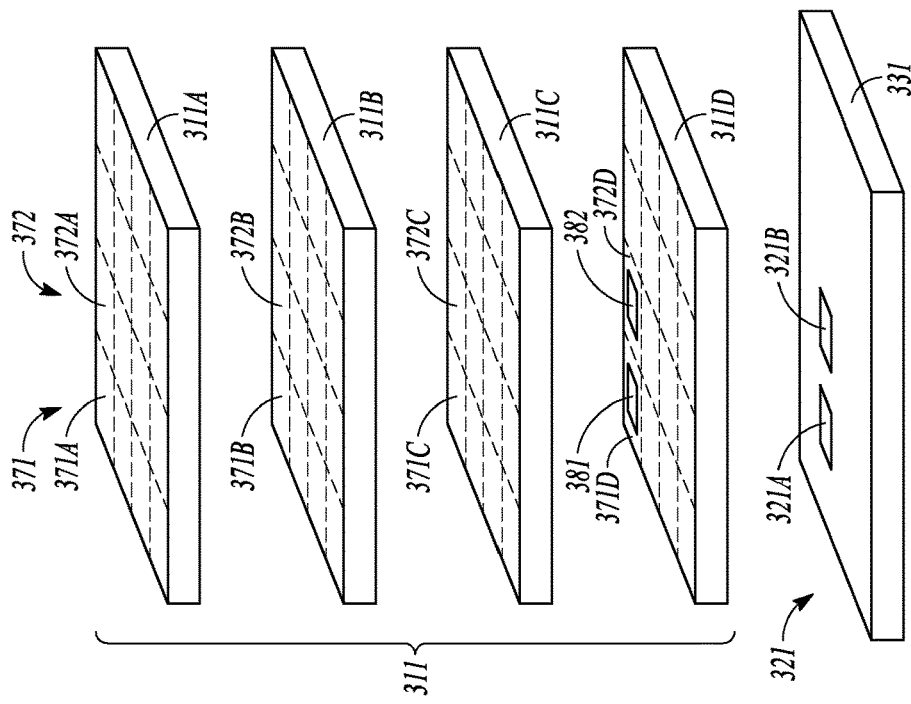
FIG. 3A shows a block diagram of a memory device including dies arranged in a stack and a controller device, according to an embodiment of the invention.

FIG. 3A shows a block diagram of a memory device 311 including dies arranged in a stack and a controller device 321 coupled to the memory device 311, according to an embodiment of the invention. Memory device 311 and controller device 321 can be used in an apparatus, such as apparatus 100 of FIG. 1. For example, memory device 311 and controller device 321 can correspond to memory device 111 and controller device 121 of FIG. 1.

As shown in FIG. 3A, memory device 311 can include dies (e.g., semiconductor dies) 311a, 311b, 311c, and 311d to store information. Dies 311a, 311b, 311c, and 311d can be referred to as memory dies (e.g., DRAM dies). FIG. 3A show four dies 311a, 311b, 311c, and 311d in memory device 311 as an example. The number of dies in memory device 311 can vary.

Each of dies 311a, 311b, 311c, and 311d can include multiple memory arrays (e.g., DRAM arrays) arranged side by side (e.g., arranged horizontally). For example, die 311a can include memory arrays 371a and 372a. Die 311b can include memory arrays 371b and 372b. Die 311c can include memory arrays 371c and 372c. Die 311d can include memory arrays 371d and 372d. For simplicity, FIG. 3A does not show labels for all of the memory arrays in each of dies 311a, 311b, 311c, and 311d.

Memory device 311 can be organized into memory vaults, such as memory vaults 371 and 372. Each of memory vaults 371 and 372 can include memory arrays from different dies. For example, memory vault 371 can include memory arrays 371a, 371b, 371c, and 371d from dies 311a, 311b, 311c, and 311d, respectively. Memory vault 372 can include memory arrays 372a, 372b, 372c, and 372d from dies 311a, 311b, 311c, and 311d, respectively. For simplicity, FIG. 3A does not show labels for all of the memory vaults of memory device 311.

Memory vaults 371 and 372 can include memory portions 381 and 382, respectively. Each of memory portions 381 and 382 can be similar to memory portion 211A of FIG. 2. For example, memory portion 381 can be configured to store information (e.g., a page table) that can include addresses of memory locations in memory vault 371 that store other information (e.g., data). Similarly, memory portion 382 can be configured to store information (e.g., a page table) that can include addresses of memory locations in memory vault 372 that store other information (e.g., data). The size of each of memory portions 321a and 321b can be based on memory tier size (e.g., size of memory tier 101) and page size in an apparatus, such as apparatus 100 (FIG. 1). As an example, each of memory portions 321a and 321b can store 4K ($2^{10}$) to 1M ($2^{20}$) pages (or higher) in a page table in a corresponding memory vault (e.g., memory vault 371 or 372).

FIG. 3A shows an example where memory portion 381 is located in die 311d. However, memory portion 381 can alternatively be located in any of dies 311a, 311b, and 311c within memory vault 371. Similarly, FIG. 3A shows an example where memory portion 382 is located in die 311d. However, memory portion 382 can alternatively be located in any of dies 311a, 311b, and 311c within memory vault 372. Although not shown in FIG. 3A, each of the other memory vaults of memory device 311 can include a memory portion similar to memory portion 381 or 382.

Controller device 321 can include a die (e.g., semiconductor die) 331, which can include components (e.g., circuitry) to control information provided to and received from memory device 311. Controller device 321 can also perform error detection, error correction, power management, memory repair, and/or other logic functions. Thus, die 331 can be referred to as logic die. Die 331 can be arranged in a stack (e.g., vertically) with dies 311a, 311b, 311c, and 311d. Alternatively, die 331 can be arranged side-by-side (e.g., horizontally) with a stack of dies 311a, 311b, 311c, and 311d.

Controller device 321 can include memory portions 321a and 321b. Each of memory portions 321a and 321b can be associated with a respective memory vault. For example, memory portion 321a can be associated with memory vault 371. Memory portion 321b can be associated with memory vault 372. For simplicity, FIG. 3A shows two memory portions 321a and 321b associated with two corresponding memory vaults (e.g., 371 and 372). Controller device 321 can include additional memory portions (similar to or identical to memory portions 321a and 321b) associated with other memory vaults (different from 371 and 372) in memory device 311.

Each of memory portions 321a and 321b can be configured to store information (e.g., a cache) that can include a portion of a page table of a corresponding memory vault. For example, memory portion 321a can store a cache of information in a page table in memory portion 381 of memory vault 371. Memory portion 321b can store a cache of information in a page table in memory portion 382 of memory vault 372. For example, memory portion 321a can store active pages (e.g., frequently used pages) among the pages in a page table in memory portion 381 of memory vault 371. Memory portion 321b can store active pages (e.g., frequently used pages) among the pages in the page table in memory portion 382 of memory vault 372. Each of memory portions 321a and 321b can include SRAM cells that can be configured to store a number of entries (e.g., 4K or higher) associated with a page table.

The operation of controller device 321 can be similar to, or identical to, that of controller device 121 described above with reference to FIG. 1 and FIG. 2. For example, in response to a request (e.g., memory read request) from a host device (e.g., host device 105), controller device 321 can access at least one of a cached page table in memory portion 321a (and/or memory portion 321b) and a page table in memory portion 381 (and/or memory portion 382) to search for information associated with the request from the host device. Controller device 321 can be configured such it can continue to search for the requested information without notifying the host device whether a page fault has occurred during accessing a page table (or page tables) in memory device. Alternatively or additionally, controller device 321 can be configured such that, if such a page fault occurs, controller device 321 can notify host device 105 of the page fault.

FIG. 3B shows memory device 311 and controller device 321 of FIG. 3A arranged in a stack, according to an embodiment of the invention. As shown in FIG. 3B, dies 311a, 311b, 311c, and 311d of memory device 311 and die 331 of controller device 321 can be arranged in a stack, where die 331 can be directly below the other dies. Die 331 and dies 311a, 311b, 311c, and 311d can be coupled to each other by through-substrate (e.g., through-silicon) vias (TSVs). Thus, memory device 311 and controller device 321 can communicate with each other through a TSV connection. FIG. 3B also shows conductive contacts 330 to allow controller device 321 to communicate with another device (e.g., host device 105 of FIG. 1). Conductive contacts 330 can include connections having solder material (e.g., solder balls and solder bumps) or other types of conductive connections. Conductive contacts 330 are used as example components to allow controller device 321 to communicate with another device. Other types of components (e.g., optical components, wireless communication components, etc.) can be used.

Figure 4:
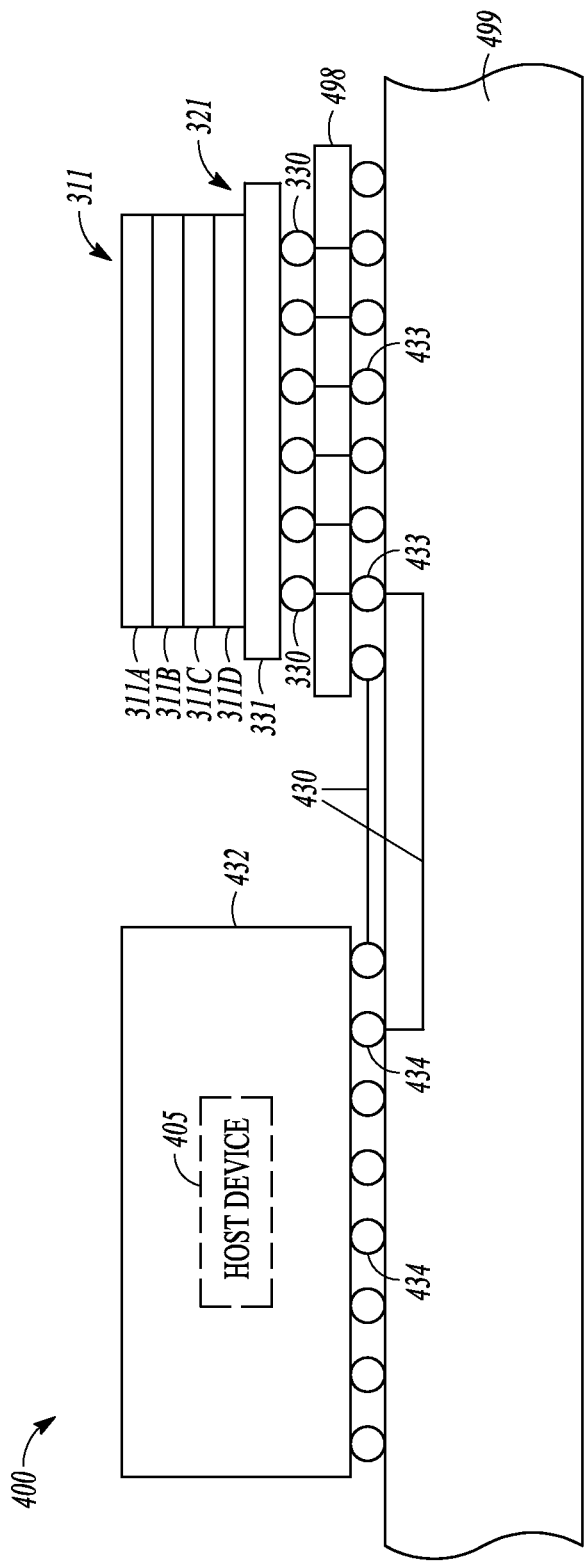
FIG. 4 shows a side view of a portion of an apparatus including a host device, memory device, and a controller device arranged over a base, according to an embodiment of the invention.

FIG. 4 shows a side view of a portion of an apparatus 400 including a host device 405, memory device 311, and controller device 321 arranged over a base 499, according to an embodiment of the invention. Memory device 311 and controller device 321 are the same as those described above with reference to FIG. 3A and FIG. 3B. Host device 405 can correspond to host device 105 of FIG. 1.

As shown in FIG. 4, apparatus 400 can include a die 432 separated from dies 311a, 311b, 311c, 311d, and 331. Die 432 can include a semiconductor die (e.g., a silicon die). Die 432 can be included in an integrated circuit (IC) package physically separated from memory device 311 and controller device 321. Host device 405 can be included in die 432 (e.g., die 432 can include circuitry that forms host device 405).

As shown in FIG. 4, memory device 311 and controller device 321 can be arranged over a support (e.g., a package substrate) 498. Support 498 can include an organic support or other materials or structures. Conductive contacts 330 can be coupled to conductive contacts 433 through conductive paths in support 498. Conductive contacts 433 can include solder material (e.g., solder balls or solder bumps), conductive pins, or other conductive connections.

Base 499 can include an organic base (e.g., a printed circuit board or other types of structures) or other non-silicon based material. Alternatively, base 499 can include a silicon-based material (e.g., a silicon interposer). Base 499 can include a connection 430 to provide communication (e.g., carry signals) between controller device 321 and host device 405. Connection 430 can correspond to connection 130 of FIG. 1 and FIG. 2. Conductive contacts 330 can be coupled to connection 430 through conductive contacts 433 of support 498. In an alternative arrangement, support 498 may be omitted and conductive contacts 330 can be directly coupled to connection 430.

Connection 430 can include conductive paths, which can include conductive traces (e.g., copper traces). As shown in FIG. 4, a portion (e.g., a group of conductive paths) of connection 430 can be disposed over (e.g., over the surface) base 499, and another portion (e.g., another group of conductive paths) of connection 430 can be disposed inside base 499. Host device 405 can include connections 434 coupled to connection 430. Connections 434 can include solder balls, conductive pins, or other conductive connections.

Figure 5:
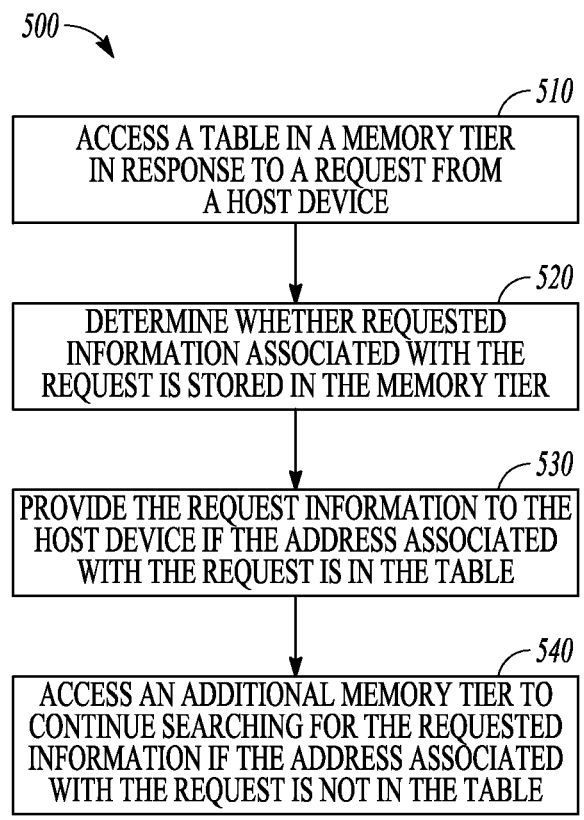
FIG. 5 is a flow diagram showing a method, according to an embodiment of the invention.

FIG. 5 is a flow diagram showing a method 500, according to an embodiment of the invention. Method 500 can be performed by at least part of apparatus (e.g., a controller unit in the apparatus) such as apparatus 100 (FIG. 1) and apparatus 400 (FIG. 4). For example, the activities in method 500 can be performed by a controller unit such as controller unit 120 described above with reference to FIG. 1 through FIG. 4. Thus, the activities in method 500 can be performed by one or more of controller device 121, 122, 123, and 321 described above with reference to FIG. 1 through FIG. 4. As shown in FIG. 5, method 500 can include activities 510, 520, 530, and 540.

Activity 510 can include accessing a data structure (e.g., a page table) in a memory tier associated with a memory unit responsive to (e.g., based at least partially on or at least partially in response to) a request from a host device. The host device can include a host device (e.g., host device 105 of FIG. 1 or host device 405 of FIG. 4) described above with reference to FIG. 1 through FIG. 4. Activity 510 can be performed by a controller unit, such as controller unit 120 of FIG. 1 and FIG. 2. For example, in activity 510, a controller device (e.g. controller device 121 in FIG. 1) can access the data structure after it receives the request from the host device. The request can include an address, which can include a physical address of a memory location in a memory device of a memory tier. The memory device can include a volatile memory device (e.g., a DRAM device).

Activity 520 of method 500 in FIG. 5 can include determining whether information associated with the request is stored in the memory tier (e.g., in a memory device in the memory tier). The associated information can be data stored at the memory location having the address associated with the request from the host device. Determining whether information associated with the request is stored in the memory tier can include comparing the address from the host device with at least one address among addresses in the data structure.

Activity 530 can include providing the associated information to the host device if the address associated with the request from the host device is in the data structure. If the address is not in the data structure, method 500 can continue with an activity (e.g., activity 540) to access an additional memory tier associated with the memory unit to determine whether information associated with the request is stored in that additional memory tier. Thus, if the address associated with the request from the host device is in the data structure, method 500 can provide the associated information from the controller device to the host device (in activity 530) without accessing the additional memory tier (e.g., without performing activity 540).

Activity 540 can include accessing an additional memory tier associated with the memory unit to continue searching for the requested information if the address associated with the request from the host is not in the data structure. The controller device that performs activity 510, 520, 530, and/or 540 may not notify the host device whether the address is in the data structure. Thus, if the address is not in the data structure, the controller device may not notify the host device that the address is not in the data structure. Method 500 may repeat at least one of activities 520, 530, and 540 to search for the requested information.

Method 500 may include fewer or more activities than the activities shown in FIG. 5. For example, method 500 can include activities associated with the operations described above with reference to FIG. 1 through FIG. 4.

The illustrations of the apparatuses (e.g., apparatus 100 and 400) and methods (e.g., method 500 and operations performed by controller unit 120) are intended to provide a general understanding of the structure of various embodiments and are not intended to provide a complete description of all the elements and features of an apparatus that might make use of the structures described herein.

The apparatuses (e.g., apparatus 100 and 400) described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 5 include apparatuses and methods having a memory unit and a controller device. The controller device can be configured to receive a request from a host device and access a data structure in the memory unit to determine whether information associated with the request is in the data structure. The controller device can be configured such that if a fault related to accessing the data structure occurs, the controller device continues searching for the information associated with the request without notifying the host device of the fault. Other embodiments, including additional apparatuses and methods, are described.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. An apparatus comprising:
a memory unit; and
a controller unit configured to receive a request from a host device and access first page table entries in the memory unit to determine whether information associated with the request is in the first page table entries,
the memory unit including a dynamic random access memory (DRAM) device and a flash memory device,
a portion of the DRAM device configured to store the first page table entries, each of the first page table entries including a first mapping between a logical address and a physical address, the logical address in the first mapping included in a memory address space used by the host device, the physical address in the first mapping including an address of a physical memory location in the DRAM device,
at least a portion of the flash memory device configured to store second page table entries, each of the second page table entries including a second mapping between a logical address and a physical address, the logical address in the second mapping included in the memory address space used by the host device, the physical address in the second mapping including an address of a physical memory location in the flash memory device, the controller unit including a DRAM controller device to control a flow of information provided to and obtained from the DRAM device, and a flash memory controller device to control a flow of information provided to and obtained from the flash memory device, wherein the DRAM controller device is configured to operate as a main controller in the controller unit to communicate directly with the host device to control the flow of information between the host device and one or more of the DRAM device and the flash memory device, the flash memory controller device is configured to communicate indirectly with the host device through the DRAM controller device such that information from the flash memory device to the host is from the flash memory device to the flash memory controller and from the flash memory controller to the DRAM controller device and such that only the DRAM controller device is configured to communicate directly with the host device, and the controller unit is configured such that if a fault related to accessing the first page table entries occurs, the controller unit continues searching for the information associated with the request without notifying the host device of the fault, wherein, the DRAM controller device includes a first memory portion to store a first cached page table, the first cached table including frequently used entries among the first page table entries;

the flash controller device includes a memory portion to store a second cache page table, the second cached page table including frequently used entries among the second page table entries, wherein the controller unit and the memory unit are configured to move new data to the DRAM device and to move old data from the DRAM device to the flash memory device when the new data is moved to the DRAM device; and the controller unit includes a hard disk drive controller to control a flow of information provided to and obtained from a hard disk drive, and the hard disk drive controller is configured to communicate with the DRAM controller device through the flash controller device, wherein there is only one connection from the hard disk drive to the host, and the only one connection includes a serial connection from the hard disk drive to the hard disk drive controller, a serial connection from the hard disk drive controller to the flash controller device, a serial connection from the flash controller device to the DRAM controller device, and a serial connection from the DRAM controller device to the host, and wherein information is only directly transferred between the hard disk drive and the hard disk drive controller through the serial connection from the hard disk drive to the hard disk drive controller, information is only directly transferred between the hard disk drive controller and the flash controller device through the serial connection from the hard disk drive controller to the flash controller device, information is only directly transferred between the flash controller device and the DRAM controller device through the serial connection from the flash controller device to the DRAM controller device, and information is only directly transferred between the DRAM controller device and the host through the serial connection from the DRAM controller device to the host.

2. The apparatus of claim 1, wherein the information associated with the request includes a physical address of a location in the memory unit.

3. The apparatus of claim 1, wherein the controller unit is configured to obtain information stored in a memory location in the memory unit, the memory location having a physical address, and the information associated with the request including the physical address of the memory location.

4. The apparatus of claim 3, wherein the controller unit is configured to provide the information stored in the memory location to the host device.

5. The apparatus of claim 1, wherein the DRAM controller device is located on a die, wherein conductive contacts are located on the die, and wherein the DRAM controller device is configured to receive the request from the host device through the conductive contacts.

6. The apparatus of claim 5, wherein the conductive contacts include solder material.

7. The apparatus of claim 1, wherein the DRAM controller device is arranged in the stack with the memory dies.

8. The apparatus of claim 1, wherein the first page table entries comprises a page table and wherein the fault comprises a page fault.

9. An apparatus comprising:
a memory unit; and
a controller unit configured to receive an address from a host device and to access first page table entries to determine whether information associated with the address is stored in a first memory portion of the memory unit based, at least in part, on whether the address is in the first page table entries, wherein the controller unit is configured to continue to access the memory unit if the address is not in the first page table entries to determine whether information associated with the address is stored in a second memory portion of the memory unit without notifying the host device that the address is not in the first page table entries, and the memory unit including a dynamic random access memory (DRAM) device and a flash memory device,
the DRAM device including the first memory portion, the flash memory device including the second memory portion, at least a portion of the DRAM device configured to store the first page table entries, each of the first page table entries including a first mapping between a logical address and a physical address, the logical address in the first mapping included in a memory address space used by the host, the physical address in the first mapping including an address of a physical memory location in the DRAM device,
at least a portion of the flash memory device configured to store second page table entries, each of the second page table entries including a second mapping between a logical address and a physical address, the logical address in the second mapping included in the memory address space used by the host, the physical address in the second mapping including an address of a physical memory location in the flash memory device,
the controller unit including a DRAM controller device to control a flow of information provided to and obtained from the DRAM device, and a flash memory controller device to control a flow of information provided to and obtained from the flash memory device, wherein the DRAM controller device is configured to operate as a main controller in the controller unit to communicate directly with the host device to control the flow of information between the host device and one or more of the DRAM device and the flash memory device, and the flash memory controller device is configured to communicate indirectly with the host device through the DRAM controller device such that information from the flash memory device to the host is from the flash memory device to the flash memory controller and from the flash memory controller to the DRAM controller device and such that only the DRAM controller device is configured to communicate directly with the host device, wherein, the DRAM controller device includes a memory portion to store a first cached page table, the first cached table including frequently used entries among the first page table entries;

the flash controller device includes a memory portion to store a second cache page table, the second cached page table including frequently used entries among the second page table entries, wherein the controller unit and the memory unit are configured to move new data to the DRAM device and to move old data from the DRAM device to the flash memory device when the new data is moved to the DRAM device; and the controller unit includes a hard disk drive controller to control a, flow of information provided to and obtained from a hard disk drive, and the hard disk drive controller is configured to communicate with the DRAM controller device through the flash controller device, wherein there is only one connection from the hard disk drive to the host, and the only one connection includes a serial connection from the hard disk drive to the hard disk drive controller, a serial connection from the hard disk drive controller to the flash controller device, a serial connection from the flash controller device to the DRAM controller device, and a serial connection from the DRAM controller device to the host, and wherein information is only directly transferred between the hard disk drive and the hard disk drive controller through the serial connection from the hard disk drive to the hard disk drive controller, information is only directly transferred between the hard disk drive controller and the flash controller device through the serial connection from the hard disk drive controller to the flash controller device, information is only directly transferred between the flash controller device and the DRAM controller device through the serial connection from the flash controller device to the DRAM controller device, and information is only directly transferred between the DRAM controller device and the host through the serial connection from the DRAM controller device to the host.

10. The apparatus of claim 9, wherein the controller unit is configured to compare the address from the host device with addresses in the first page table entries to determine whether the address from the host device is in the first page table entries.

11. The apparatus of claim 10, wherein the controller unit is configured to obtain the information associated with the address from the first memory portion of the memory, unit and provide the obtained information to the host device if the address from the host device matches an address among the addresses in the first page table entries.

12. An apparatus comprising:
a first memory tier including a first memory device to store information;
a second memory tier including a second memory device to store information, the first and second memory devices having memory cells of different types; and
a controller unit to control a flow of information between a host device and the first and second memory tiers, the controller unit configured to:

access a first cached page table stored in a memory portion of the controller unit responsive to a request from the host device to determine whether an address associated with the request from the host matches one of the addresses in the first cached page table;

access a first page table entries stored in the first memory tier to determine whether information associated with the request is stored in the first memory tier if the address associated with the request from the host does not match one of the addresses in the first cached page table; and access the second memory tier to determine whether information associated with the request is stored in the second memory tier if information in the first page table entries does not indicate that information associated with the request is stored in the first memory tier, the first memory device including a dynamic random access memory (DRAM) device, the second memory device including a flash memory device, at least a portion of the DRAM device configured to store the first page table entries, each of the first page table entries including a first mapping between a logical address and a physical address, the logical address in the first mapping included in a memory address space used by the host, the physical address in the first mapping including an address of a, physical memory location in the DRAM device, at least a portion of the flash memory device configured to store second page table entries, each of the second page table entries including a second mapping between a logical address and a physical address, the logical address in the second mapping included in the memory address space used by the host, the physical address in the second mapping including an address of a physical memory location in the flash memory device, the controller unit including a DRAM controller device to control a flow of information provided to and obtained from the DRAM device, and a flash memory controller device to control a flow of information provided to and obtained from the flash memory device, wherein the DRAM controller device is configured to operate as a main controller in the controller unit to communicate directly with the host device to control the flow of information between the host device and one or more of the DRAM device and the flash memory device, and the flash memory controller device is configured to communicate indirectly with the host device through the DRAM controller device such that information from the flash memory device to the host is front the flash memory device to the flash memory controller and from the flash memory controller to the DRAM controller device and such that only the DRAM controller device is configured to communicate directly with the host device, wherein, the DRAM controller device includes a memory portion to store the first cached page table, the first cached table including frequently used entries among the first page table entries;

the flash controller device includes a memory portion to store a second cache page table, the second cached page table including frequently used entries among the second page table entries, wherein the first and second memory tiers are configured to move new data to the DRAM device and to move old data from the DRAM device to the flash memory device when the new data is moved to the DRAM device; and the controller unit includes a hard disk drive controller to control a flow of information provided to and obtained from a hard disk drive, and the hard disk drive controller is configured to communicate with the DRAM controller device through the flash controller device, wherein there is only one connection from the hard disk drive to the host, and the only one connection includes a serial connection from the hard disk drive to the hard disk drive controller, a serial connection from the hard disk drive controller to the flash controller device, a serial connection from the flash controller device to the DRAM controller device, and a serial connection from the DRAM controller device to the host, and wherein information is only directly transferred between the hard disk drive and the hard disk drive controller through the serial connection from the hard disk drive to the hard disk drive controller, information is only directly transferred between the hard disk drive controller and the flash controller device through the serial connection from the hard disk drive controller to the flash controller device, information is only directly transferred between the flash controller device and the DRAM controller device through the serial connection from the flash controller device to the DRAM controller device, and information is only directly transferred between the DRAM controller device and the host through the serial connection from the DRAM controller device to the host.

13. The apparatus of claim 12, wherein the memory portion of the controller unit and the first memory device include memory cells of different types.

14. The apparatus of claim 13, wherein the memory portion of the controller unit includes static random access memory (SRAM) cells.

15. The apparatus of claim 12, wherein the controller unit is configured to move information in and out of first page table entries without an intervention from the host device, an operating system, or both associated with the apparatus.

16. The apparatus of claim 12, wherein the controller unit is configured move information in and out of the first page table entries responsive to a command from the host vice, an operating system, or both associated with the apparatus.

17. The apparatus of claim 12, wherein the first page table entries comprises a table including data associated with a portion of an address, and the controller unit is configured to provide the data associated with the portion of the address to the host device if the address associated with the request is in the table.

18. An apparatus comprising:
a memory unit including a volatile memory device and a nonvolatile memory device; and
a controller unit to control a flow of information between a host device and the volatile memory device and the nonvolatile memory device, the controller unit configured to:
access first page table entries in the volatile memory device to determine whether information associated with an address provided by the host device is stored in the volatile memory device; and
access a second page table entries in the nonvolatile memory device to determine whether information associated with the address is stored in the nonvolatile memory device if no address in the first cached page table entries matches the address provided by the host device,
the volatile memory device including a dynamic random access memory (DRAM) device, the non-volatile memory device including a flash memory device, at least a portion of the DRAM device configured to store the first page table entries, each of the first page table entries including a first mapping between a logical address and a physical address, the logical address in the first mapping included in a memory address space used by the host, the physical address in the first mapping including an address of a physical memory location in the DRAM device,
at least a portion of the flash memory device configured to store the second page table entries, each of the second page table entries including a second mapping between a logical address and a physical address, the logical address in the second mapping included in the memory address space used by the host, the physical address in the second mapping including an address of a physical memory location in the flash memory device,
the controller unit including a DRAM controller device to control a flow of information provided to and obtained from the DRAM device, and a flash memory controller device to control a flow of information provided to and obtained from the flash memory device,
wherein the DRAM controller device is configured to operate as a main controller in the controller unit to communicate directly with the host device to control the flow of information between the host device and one or more of the DRAM device and the flash memory device, and the flash memory controller device is configured to communicate indirectly with the host device through the DRAM controller device such that information from the flash memory device to the host is from the flash memory device to the flash memory controller and from the flash memory controller to the DRAM controller device and such that only the DRAM controller device is configured to communicate directly with the host device,
wherein, the DRAM controller device includes a memory portion to store a first cached page table, the first cached table including frequently used entries among the first page table entries;
the flash controller device includes a memory portion to store a second cache page table, the second cached page table including frequently used entries among the second page table entries, wherein the controller unit and the memory unit are configured to move new data to the DRAM device and to move old data from the DRAM device to the flash memory device when the new data is moved to the DRAM device; and
the controller unit includes a hard disk drive controller to control a flow of information provided to and obtained from a hard disk drive, and the hard disk drive controller is configured to communicate with the DRAM controller device through the flash controller device, wherein there is only one connection from the hard disk drive to the host, and the only one connection includes a serial connection from the hard disk drive to the hard disk drive controller, a serial connection from the hard disk drive controller to the flash controller device, a serial connection from the flash controller device to the DRAM controller device, and a serial connection from the DRAM controller device to the host, and wherein information is only directly transferred between the hard disk drive and the hard disk drive controller through the serial connection from the hard disk drive to the hard disk drive controller, information is only directly transferred between the hard disk drive controller and the flash controller device through the serial connection from the hard disk drive controller to the flash controller device, information is only directly transferred between the flash controller device and the DRAM controller device through the serial connection from the flash controller device to the DRAM controller device, and information is only directly transferred between the DRAM controller device and the host through the serial connection from the DRAM controller device to the host.

19. The apparatus of claim 18, wherein the controller unit is configured to access the hard disk drive in the memory unit to continue searching for information associated with the address if no address among the addresses in the first and second page table entries matches the address provided by the host device.

20. The apparatus of claim 18, wherein the DRAM controller device included in a semiconductor die separated from the host device.

21. A method comprising:
accessing first page table entries in a first memory tier responsive to a request from a host device, the request including an address;
determining whether information associated with the address is stored in the first memory tier based, at least in part, on whether the address is in the first page table entries; and
providing the information to the host device if the address is in the first page table entries; and
accessing a second memory tier to determine whether information associated with the address is stored in the second memory tier responsive to the address not being in the first page table entries, wherein accessing the first memory tier is performed by a controller unit coupled to the host device, and the controller unit does not notify the host device whether the address is in the first page table entries,
the first memory tier including a dynamic random access memory (DRAM) device, the second memory tier including a flash memory device, at least a portion of the DRAM device configured to store the first page table entries, each of the first page table entries including a first mapping between a logical address and a physical address, the logical address in the first mapping included in a memory address space used by the host, the physical address in the first mapping including an address of a physical memory location in the DRAM device,
at least a portion of the flash memory device configured to store second page table entries, each of the second page table entries including a second mapping between a logical address and a physical address, the logical address in the second mapping included in the memory address space used by the host, the physical address in the second mapping including an address of a physical memory location in the flash memory device;
controlling, using a DRAM controller device of the controller unit, a flow of information provided to and obtained from the DRAM device of the controller unit, wherein the first and second memory tiers are configured to move new data, to the DRAM device and to move old data from the DRAM device to the flash memory device when the new data is moved to the DRAM device;
controlling, using a flash memory controller device, a flow of information provided to and obtained from the flash memory device; and operating the DRAM controller device as a main controller in the controller unit to communicate directly with the host device to control the flow of information between the host device and one or more of the DRAM device and the flash memory device, and operating the flash memory controller to communicate indirectly with the host device through the DRAM controller device such that information from the flash memory device to the host is from the flash memory device to the flash memory controller and from the flash memory controller to the DRAM controller device and such that only the DRAM controller device is configured to communicate directly with the host device, wherein, storing a first cached page table in a memory portion of the DRAM controller device, the first cached table including frequently used entries among the first page table entries; and storing a second cache page table in a memory portion of the flash controller device, the second cached page table including frequently used entries among the second page table entries; and controlling a flow of information provided to and obtained from a hard disk drive, wherein the controller unit includes a hard disk drive controller to control the flow of information provided to and obtained from the hard disk drive, and the hard disk drive controller is configured to communicate with the DRAM controller device through the flash controller device, wherein there is only one connection from the hard disk drive to the host, and the only one connection includes a serial connection from the hard disk drive to the hard disk drive controller, a serial connection from the hard disk drive controller to the flash controller device, a serial connection from the flash controller device to the DRAM controller device, and a serial connection from the DRAM controller device to the host, and wherein information is only directly transferred between the hard disk drive and the hard disk drive controller through the serial connection from the hard disk drive to the hard disk drive controller, information is only directly transferred between the hard disk drive controller and the flash controller device through the serial connection from the hard disk drive controller to the flash controller device, information is only directly transferred between the flash controller device and the DRAM controller device through the serial connection from the flash controller device to the DRAM controller device, and information is only directly transferred between the DRAM controller device and the host through the serial connection from the DRAM controller device to the host.

22. The method of claim 21, further comprising:
accessing the first cached page table before accessing the first page table entries to determine whether information associated with the address is stored in the first memory tier.

23. The method of claim 21, wherein the address includes a physical address of a memory location in the memory unit.

24. The method of claim 21, wherein the information associated with the address includes user data.

25. A method comprising:
receiving an address from a host device;
comparing the address received from the host device with addresses in a first page table entries associated with information stored in a volatile memory device;
comparing the address received from the host device with addresses in a second page table entries associated with information stored in a nonvolatile memory device responsive to no address among the addresses in the first page table entries matching the address from the host device;

providing information to the host device if the address received from the host device matches an address among the addresses in the first page table entries and the addresses in the second page table entries, wherein the provided information is stored at a memory location associated with the address received from the host device, the first memory tier including a dynamic random access memory (DRAM) device, the second memory tier including a flash memory device, at least a portion of the DRAM device configured to store the first page table entries, each of the first page table entries including a first mapping between a logical address and a physical address, the logical address in the first mapping included in a memory address space used by the host, the physical address in the first mapping including an address of a physical memory location in the DRAM device, at least a portion of the flash memory device configured to store the second page table entries, each of the second page table entries including a second mapping between a logical address and a physical address, the logical address in the second mapping included in the memory address space used by the host, the physical address in the second mapping including an address of a physical memory location in the flash memory device;

controlling, using a DRAM controller device of a controller unit, a flow of information provided to and obtained from the DRAM device;

controlling, using a flash memory controller device the controller unit, a flow of information provided to and obtained from the flash memory device, wherein the first and second memory tiers are configured to move new data to the DRAM device and to move old data from the DRAM device to the flash memory device when the new data is moved to the DRAM device; and operating the DRAM controller device as a main controller in the controller unit to communicate directly with the host device to control the flow of information between the host device and one or more of the DRAM device and the flash memory device, and operating the flash memory controller device to communicate indirectly with the host device through the DRAM controller device such that information from the flash memory device to the host is from the flash memory' device to the flash memory controller and from the flash memory controller to the DRAM controller device and such that only the DRAM controller device is configured to communicate directly with the host device, wherein, storing a first cached page table in a memory portion of the DRAM controller device, the first cached table including frequently used entries among the first page table entries; and storing a second cache page table in a memory portion of the flash controller device, the second cached page table including frequently used entries among the second page table entries; and controlling a flow of information provided to and obtained from a hard disk drive, wherein the controller unit includes a hard disk drive controller to control the flow of information provided to and obtained from the hard disk drive, and the hard disk drive controller is configured to communicate with the DRAM controller device through the flash controller device, wherein there is only one connection from the hard disk drive to the host, and the only one connection includes a serial connection from the hard disk drive to the hard disk drive controller, a serial connection from the hard disk drive controller to the flash controller device, a serial connection from the flash controller device to the DRAM controller device, and a serial connection from the DRAM controller device to the host, and wherein information is only directly transferred between the hard disk drive and the hard disk drive controller through the serial connection from the hard disk drive to the hard disk drive controller, information is only directly transferred between the hard disk drive controller and the flash controller device through the serial connection from the hard disk drive controller to the flash controller device, information is only directly transferred between the flash controller device and the DRAM controller device through the serial connection from the flash controller device to the DRAM controller device, and information is only directly transferred between the DRAM controller device and the host through the serial connection from the DRAM controller device to the host.

26. The method of claim 25, further comprising:
refraining from notifying the host device whether the address received or the host device matches an address among the addresses in the first page table entries.

27. The method of claim 26, further comprising:
refraining from notifying the host device whether the address received from the host device matches an address among the addresses in the second page table entries.

* * * * *